US009338925B2

(12) United States Patent
Nakano et al.

(10) Patent No.: US 9,338,925 B2
(45) Date of Patent: May 10, 2016

(54) DEVICE FOR CONTROLLING DRIVE OF MOTOR FOR ELECTRIC POWER STEERING DEVICE

(75) Inventors: Masatsugu Nakano, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 326 days.

(21) Appl. No.: 13/703,992

(22) PCT Filed: Feb. 23, 2011

(86) PCT No.: PCT/JP2011/053926
§ 371 (c)(1),
(2), (4) Date: Dec. 13, 2012

(87) PCT Pub. No.: WO2012/056735
PCT Pub. Date: May 3, 2012

(65) Prior Publication Data
US 2013/0088128 A1    Apr. 11, 2013

(30) Foreign Application Priority Data
Oct. 27, 2010    (JP) .................................. 2010-240661

(51) Int. Cl.
*H05K 7/06*    (2006.01)
*H05K 7/20*    (2006.01)
(Continued)

(52) U.S. Cl.
CPC ............ *H05K 7/2039* (2013.01); *B62D 5/0406* (2013.01); *H02K 11/0068* (2013.01);
(Continued)

(58) Field of Classification Search
CPC .. B62D 5/04; B62D 5/50406; H02K 11/0068; H02K 5/22; H02K 7/116; H02K 11/33; H02P 7/00; H05K 7/06; H05K 7/209; H05K 7/2039; H05K 7/20445; H05K 7/20854

USPC .......................... 310/68 R, 68 D, 43; 318/432
See application file for complete search history.

(56) References Cited

U.S. PATENT DOCUMENTS

| 5,844,386 A | 12/1998 | Matsuoka et al. |
| 7,989,997 B2 | 8/2011 | Hashimoto et al. |

(Continued)

FOREIGN PATENT DOCUMENTS

| JP | 9-24847 A | 1/1997 |
| JP | 2000-43740 A | 2/2000 |

(Continued)

OTHER PUBLICATIONS

Tominaga, Tsutomu; Kimata, Masahiro; Fujimoto, Tadayuki, Electric Power Steering Device (English Machine Translation), Jul. 30, 2009, WIPO Publication WO2009/093331.*

(Continued)

*Primary Examiner* — Terrance Kenerly
*Assistant Examiner* — Alexander Singh
(74) *Attorney, Agent, or Firm* — Sughrue Mion, PLLC; Richard C. Turner

(57) ABSTRACT

A device designed to reduce temperature rise in its control board. The device includes a switching element; a coil; a smoothing capacitor; an electrical connection member for electrically connecting the switching element with the smoothing capacitor and the coil; a control board that mounts a control element; a control signal line for electrically connecting the switching element with the control board; and a switching element placing portion for placing the switching element thereon. The electrical connection member is arranged between the switching element and the control board; the smoothing capacitor and the coil are arranged, with respect to the electrical connection member, on a side of the switching element; and end surfaces of the smoothing capacitor and the coil are positioned, with respect to the electrical connection member, apart from a plane where the switching element and the switching element placing portion are adjoined together.

1 Claim, 12 Drawing Sheets

(51) Int. Cl.
  *B62D 5/04* (2006.01)
  *H02K 11/00* (2016.01)
(52) U.S. Cl.
  CPC ............... *H02K11/33* (2016.01); *H05K 7/06* (2013.01); *H05K 7/209* (2013.01); *H05K 7/20445* (2013.01); *H05K 7/20854* (2013.01)

(56) References Cited

U.S. PATENT DOCUMENTS

| | | | |
|---|---|---|---|
| 9,045,156 | B2* | 6/2015 | Omae .................. B62D 5/0406 |
| 2001/0021103 | A1* | 9/2001 | Takagi ......................... 361/752 |
| 2003/0173920 | A1* | 9/2003 | Tominaga ............ B62D 5/0406 318/432 |
| 2005/0167183 | A1* | 8/2005 | Tominaga et al. ............ 180/444 |
| 2006/0108884 | A1 | 5/2006 | Shiino et al. |
| 2006/0250049 | A1* | 11/2006 | Park et al. ...................... 310/344 |
| 2007/0045037 | A1* | 3/2007 | Yoshinari et al. ............. 180/444 |
| 2008/0106160 | A1* | 5/2008 | Yoshinari et al. ........... 310/68 D |
| 2008/0110492 | A1* | 5/2008 | Buller et al. .................. 136/251 |
| 2010/0052449 | A1 | 3/2010 | Hashimoto et al. |
| 2010/0288577 | A1 | 11/2010 | Sonoda et al. |
| 2010/0314192 | A1 | 12/2010 | Nagase et al. |
| 2010/0327678 | A1* | 12/2010 | Yamasaki et al. ............... 310/64 |
| 2010/0327680 | A1* | 12/2010 | Miyachi et al. ................. 310/71 |
| 2010/0327709 | A1* | 12/2010 | Minato et al. ............... 310/68 D |
| 2011/0011633 | A1 | 1/2011 | Uchida et al. |
| 2011/0066332 | A1* | 3/2011 | Sonoda et al. .................. 701/42 |

FOREIGN PATENT DOCUMENTS

| | | | |
|---|---|---|---|
| JP | 2000-318628 | A | 11/2000 |
| JP | 2001206232 | A | 7/2001 |
| JP | 2002345211 | A | 11/2002 |
| JP | 2003-267233 | A | 9/2003 |
| JP | 200423877 | A | 1/2004 |
| JP | 2004023877 | A | 1/2004 |
| JP | 200448823 | A | 2/2004 |
| JP | 2006-168705 | A | 6/2006 |
| JP | 2006180643 | A | 7/2006 |
| JP | 200762433 | A | 3/2007 |
| JP | 2007-186145 | A | 7/2007 |
| JP | 2008174097 | A | 7/2008 |
| JP | 2009-12631 | A | 1/2009 |
| JP | 4252486 | B2 | 4/2009 |
| JP | 2009124772 | A | 6/2009 |
| JP | 2009188271 | A | 8/2009 |
| JP | 2009248864 | A | 10/2009 |
| JP | 2010-30489 | A | 2/2010 |
| JP | 2010-63242 | A | 3/2010 |
| JP | 201092999 | A | 4/2010 |
| JP | 2010-195219 | A | 9/2010 |
| WO | 2008/146664 | A1 | 12/2008 |
| WO | WO 2009093331 | A1 * | 7/2009 |
| WO | 2009/101779 | A1 | 8/2009 |
| WO | 2009101779 | A1 | 8/2009 |
| WO | 2009125506 | A1 | 10/2009 |
| WO | 2010/007672 | A1 | 1/2010 |
| WO | 2010007672 | A1 | 1/2010 |

OTHER PUBLICATIONS

Japanese Office Action issued on Nov. 12, 2013 in Japanese Patent Application No. 2012-540703.
International Search Report for PCT/JP2010/068691 dated Jan. 25, 2011.
Communication dated Jan. 6, 2015 from the State Intellectual Property Office of People's Republic of China in counterpart Application No. 201180046636.4.

* cited by examiner

A

DEVICE FOR CONTROLLING DRIVE OF MOTOR FOR ELECTRIC POWER STEERING DEVICE

CROSS REFERENCE TO RELATED APPLICATIONS

This application is a National Stage of International Application No. PCT/JP2011/053926, filed on Feb. 23, 2011, which claims priority from Japanese Patent Application No. 2010-240661, filed on Oct. 27, 2010, the contents of all of which are incorporated herein by reference in their entirety.

TECHNICAL FIELD

This invention relates to a motor drive control device for electric power steering that drives and controls a motor used in, for example, an electric power steering system for vehicles.

BACKGROUND ART

Heretofore, as for a motor drive control device for electric power steering that drives and controls a motor used in an electric power steering system, there has been proposed such a configuration, as a compact and highly reliable one, that a smoothing capacitor as a component for driving and controlling is disposed between a power board and a control board (Refer to Patent Document 1, for example).

Further, as a motor drive control device in a form integrated with the motor, there has been proposed such a configuration that a power element and a semiconductor switching element are mounted on a board fixed to a metallic case (Refer to Patent Document 2, for example).

CITATION LIST

Patent Documents

Patent Document 1: Japanese Patent Application Laid-Open No. 2010-063242
Patent Document 2: International Publication No. WO2010/007672 pamphlet

SUMMARY OF THE INVENTION

Problems to be Solved by the Invention

However, according to the control device disclosed in Patent Document 1, although its control module and its power module are apart from each other, there is a problem that a temperature rise in the control module becomes larger due to heat generation of the smoothing capacitor and a coil, because the capacitor and the coil are placed near the control module.

Meanwhile, according to the control device disclosed in Patent Document 2, there is the same kind of problem because a capacitor is placed near a microcomputer.

This invention has been made to solve the above problems, and an object thereof is to provide a motor drive control device for electric power steering which is designed to reduce temperature rise in its control board due to heat generated not only by a switching element but also by a smoothing capacitor and a coil, and also to be compact.

Means for Solving the Problems

A motor drive control device for electric power steering according to the invention, is a motor drive control device for electric power steering that drives and controls a motor used in an electric power steering system, and comprises:
  a switching element that supplies a current to the motor; one or more coil(s); one or more smoothing capacitor(s); an electrical connection member that electrically connects the switching element with the smoothing capacitor(s) and with the coil(s); a control board that mounts a control element; a control signal line that electrically connects the switching element with the control board; and a switching element placing portion on which the switching element is placed,
  wherein the electrical connection member is arranged between the switching element and the control board, and at least one of the smoothing capacitor(s) and at least one of the coil(s) are arranged, with respect to the electrical connection member, on a side where the switching element is placed, and wherein end surfaces of the smoothing capacitor(s) and the coil(s) arranged on the side where the switching element is placed, are positioned, with respect to the electrical connection member, apart from a plane where the switching element and the switching element placing portion are adjoined together.

Effect of the Invention

According to the motor drive control device for electric power steering of the invention, it is possible to spread the distance not only between the control board and the switching element, but also between the control board and the smoothing capacitor(s) & coil(s); therefore, such an effect is created that temperature rise in the control board and the control element can be suppressed thereby enhancing reliability, and that a height of the control device can be made lower thereby making it compact.

MODE FOR CARRYING OUT THE INVENTION

Hereinafter, preferred embodiments of a motor drive control device for electric power steering of the invention will be described with reference to the accompanying drawings. It should be noted that the invention is not limited to the embodiments, and various design modifications thereof may fall within the scope of the invention.

Embodiment 1

Figure 1:
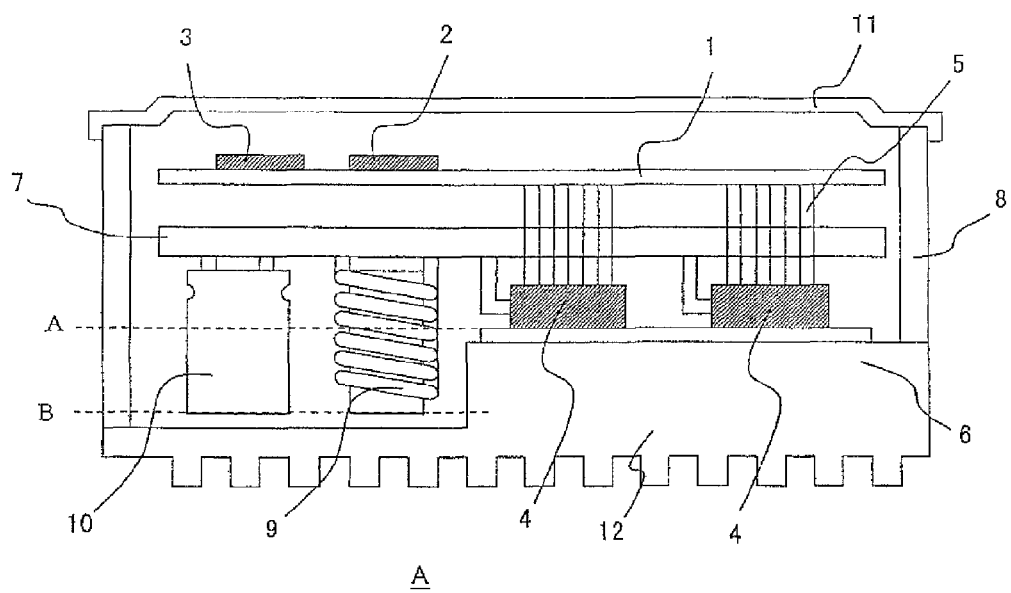
FIG. 1 is a diagram illustrating a motor drive control device for electric power steering according to Embodiment 1 of the invention.

FIG. 1 is a diagram illustrating a motor drive control device for electric power steering (hereinafter, simply referred to as a motor drive control device, in the respective embodiments) according to Embodiment 1 of the invention. The motor drive control device A according to Embodiment 1 is configured with a control board 1 on which a microcomputer 2 and a control element constituting an FET driving circuit 3 (hereinafter, referred to as an FET driving circuit) are mounted, so as to send control signals from the control board 1 to switching elements 4, as electrical signals, through control signal lines 5. The switching elements 4 each comprise a substrate and an FET mounted thereon or a resin molded bare chip of FET. In addition, for the purpose of current detection, a shunt resistance may be installed.

The switching elements 4 supply a current necessary for a motor to be described later, to drive the motor. Further, the switching elements 4 are placed on a switching element placing portion 6. The switching element placing portion 6 is formed of a metal such as aluminum, and serves to reduce temperature rise in the switching elements 4 by absorbing heat generated by the switching elements 4. The switching elements 4 may be mounted on a metal substrate and connected with the switching element placing portion 6 through the metal substrate, or the switching elements 4 may be connected with the switching element placing portion 6 through an adhesive or a solder.

A power to the switching elements is supplied through an electrical connection member 7. The electrical connection member 7 is formed of a metallic bus bar and an insulating member such as a resin, although the detailed configuration is omitted in FIG. 1. The metallic bus bar serves to supply a current, and the resin serves to ensure electrical insulation between the bus bar and another component such as a case 8 or the like, and to support the bus bar as a frame. In addition, the electrical connection member 7 includes a coil 9 for removing a noise, and a smoothing capacitor 10 for reducing a ripple current by the switching elements 4. The electrical connection member 7 is flat plate-like, and its planar size is equal to, or similar to, the planar size of the control board 1. These objects described above are covered by the switching element placing portion 6, the case 8 and a cover 11, to constitute the motor drive control device A. Note that the reference numeral 12 shown in FIG. 1 represents a heat sink which is formed as integrated with, or independent of, the switching element placing portion 6.

Figure 2:
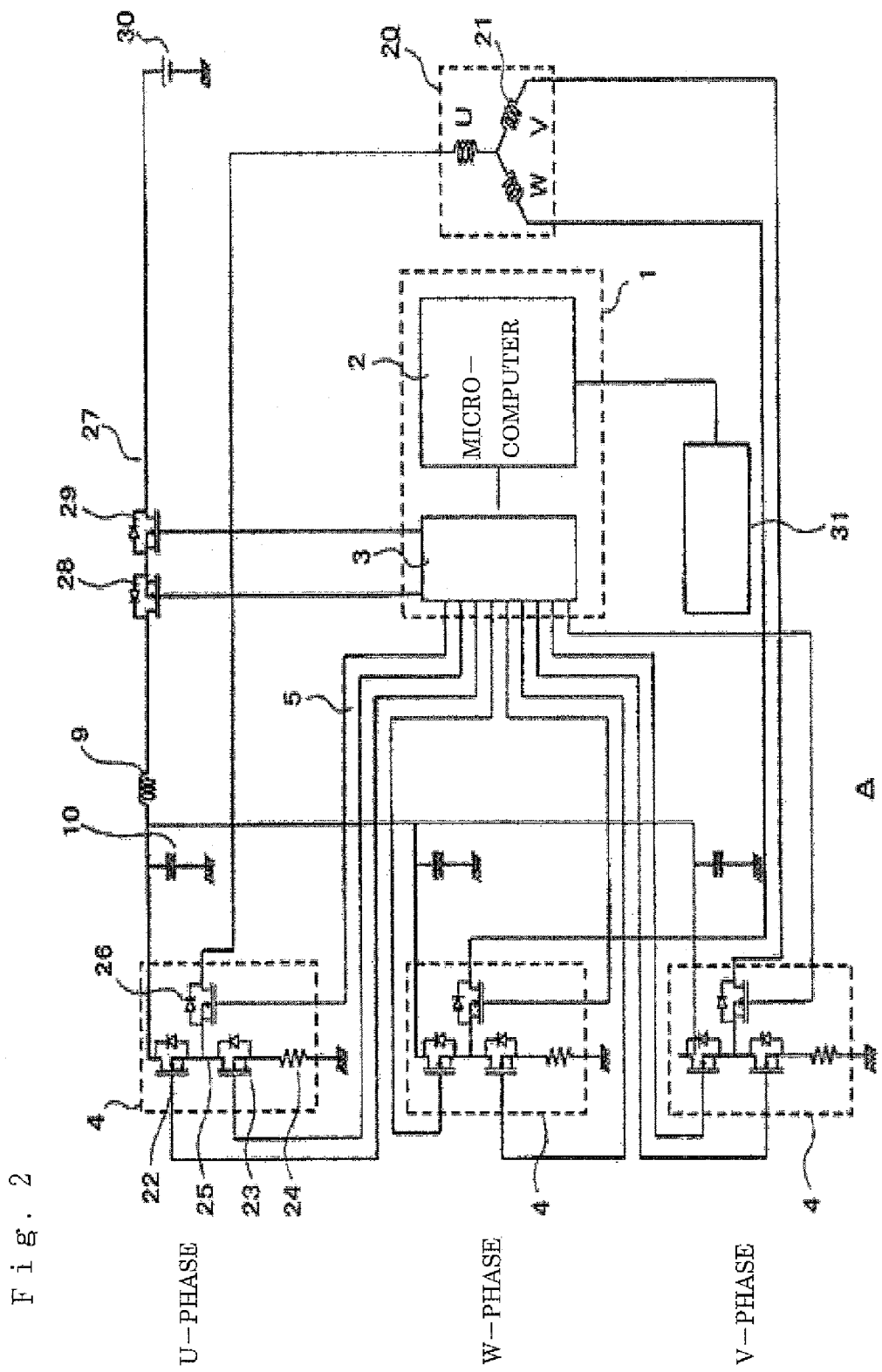
FIG. 2 is a circuit diagram of the motor drive control device for electric power steering according to Embodiment 1 of the invention.

FIG. 2 is a circuit diagram of the motor drive control device A according to Embodiment 1 described in FIG. 1. Hereinafter, a description will be made how the respective components in FIG. 1 are connected, using the circuit diagram. Armature windings 21 of a motor 20 to be drive-controlled by the motor drive control device A, are connected in Y-connection. As to FETs 22 and 23 that are mounted in the switching element 4 with their one ends being connected with each other, one FET 22 constitutes a positive (+)-side arm of U-phase of a three-phase bridge circuit, and the other FET 23 constitutes a negative (−)-side arm of U-phase. Further, the other end of the FET 22 is connected to the smoothing capacitor 10 for absorbing a ripple and the coil 9 for absorbing a noise, and the other end of the FET 23 is connected through a shunt resistance 24 to an earth potential portion of a vehicle.

A connection point 25, where the respective one ends of the FETs 22 and 23 are connected, forms a U-phase AC terminal of the three-phase bridge circuit. As to another FET 26 mounted in the switching element 4, its one end is connected to the U-phase AC terminal 25, and the other end is connected to a U-phase terminal of the armature windings 21. Note that a similar configuration is applied for W-phase and V-phase.

As to two FETs 28 and 29 that are mounted in a power relay 27, their one ends are connected with each other, and the other end of one FET 28 is connected through the coil 9 to a positive (+) DC terminal of the three-phase bridge circuit, and the other end of the other FET 29 is connected through a power connector (not shown) to a battery 30 installed in a vehicle.

The FET driving circuit 3 mounted on the control board 1 has output terminals connected to the respective gate of the FETs 28 and 29, and is configured to apply gate driving signals onto the respective gates at their respective predetermined timings. The microcomputer 2 mounted on the control board 1, controls the timings for outputting the gate driving signals outputted by the FET driving circuit 3, based on a revolution detection signal from a revolution sensor 31 that detects the revolution speed of the motor 20.

In a power steering system equipped with the motor drive control device A according to Embodiment 1 that is configured as described above, when a driver operates a steering wheel to put a steering torque on a steering shaft, a torque detector (not shown) detects the steering torque and inputs it to the microcomputer 2. In addition, a revolution detection signal that corresponds to the steering revolution speed detected by the revolution sensor 31, is inputted to the microcomputer 2. The microcomputer 2 calculates an assist torque, based on the inputted steering torque and steering revolution speed and on a vehicle speed signal or the like, and controls the three-phase bridge circuit of the motor drive control device A such that the assist torque, as a torque to be put on the steering shaft through a deceleration mechanism, is generated in the motor 20.

That is, the FET driving circuit 3 generates gate driving signals at predetermined timings, based on the instruction from the microcomputer 2, to thereby control conduction of each FET in the three-phase bridge circuit. This causes the three phase bridge circuit to generate an intended three-phase AC current, thereby supplying the three-phase AC current to the armature windings 21 to drive the motor 20. The torque generated by the motor 20 is put on the steering shaft, as an assist torque, through the steering mechanism. Accordingly, the steering force by a driver is reduced. Here, while the description is made for a case where the armature windings 21 of the motor 20 are connected in Y-connection, they may, of course, be connected in Δ-connection.

Figure 3:
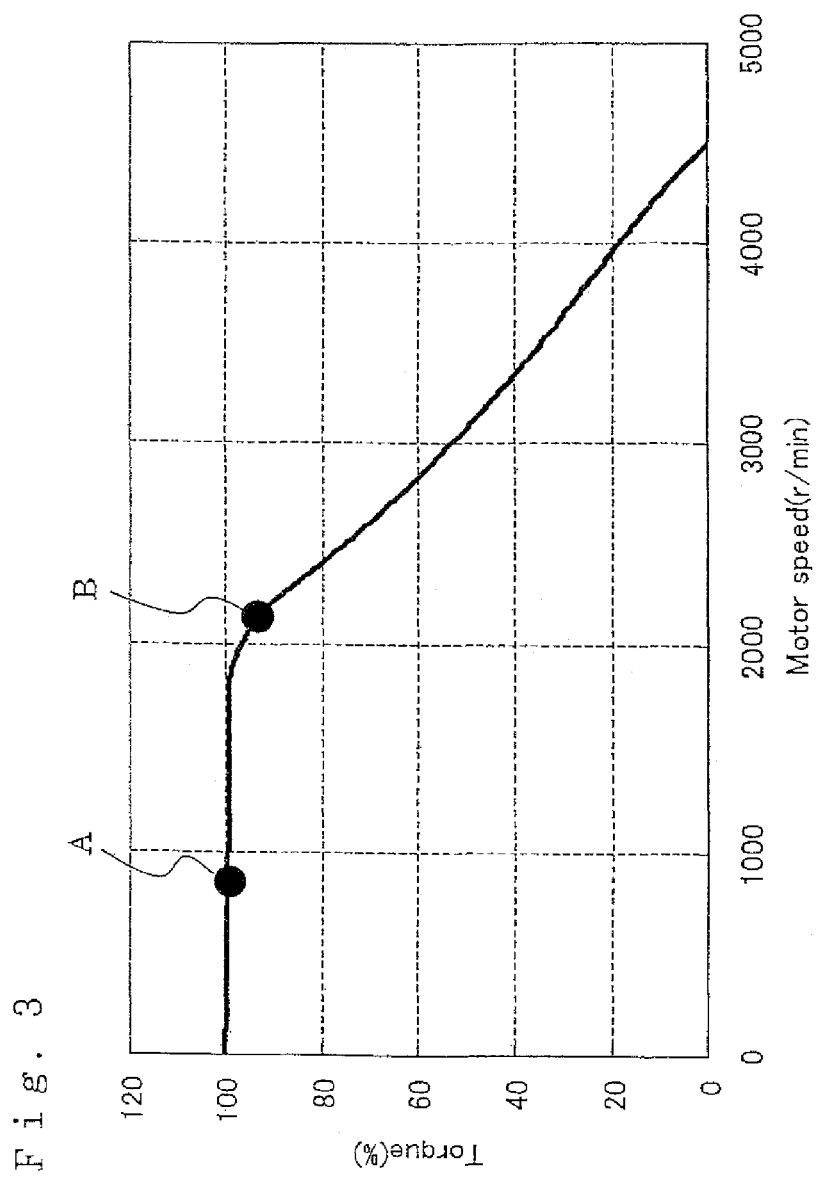
FIG. 3 is a chart showing a revolution speed-torque characteristic of a motor according to Embodiment 1 of the invention.

FIG. 3 is a chart showing a N-T characteristic that represents a relation between a revolution speed and a torque of the motor 20, where the abscissa axis represents a revolution speed of the motor 20 and the ordinate axis represents a torque of the motor 20.

A loss of the motor drive control device A varies depending on a driving state of the motor 20. In FIG. 3, the point indicated by the mark A represents a driving state of low revolution speed with maximum torque, and the point indicated by the mark B represents a driving state in which the output becomes maximum and the input power to the motor drive control device becomes maximum. The loss of the smoothing capacitor 10 and the loss of the coil 9 in each state are shown in FIG. 4.

Figure 4:
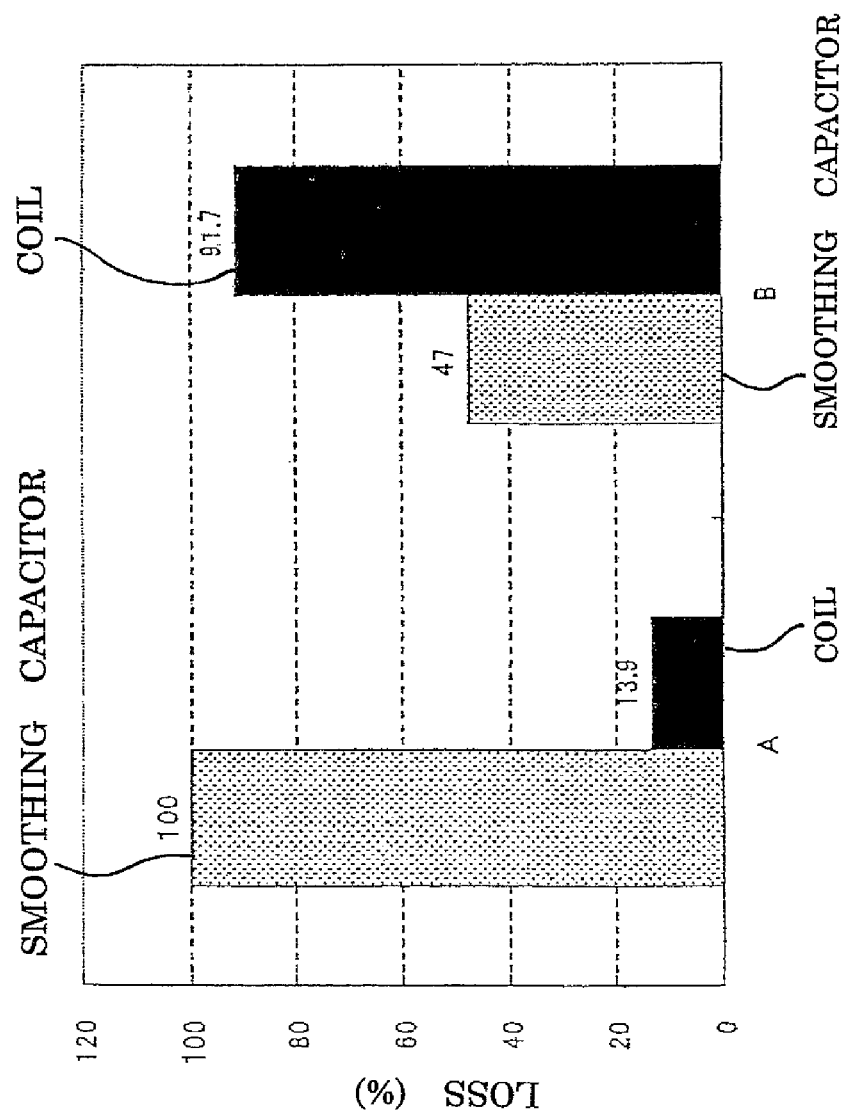
FIG. 4 is a diagram illustrating a loss of the motor drive control device for electric power steering according to Embodiment 1 of the invention.

In FIG. 4, the ordinate axis represents a loss that is normalized by the loss value of the smoothing capacitor 10 in the driving state A, to be expressed as numbers of percent (%). As shown in FIG. 4, in the driving state A, the loss of the smoothing capacitor 10 is large and the loss of the coil 9 is small, whereas, in the driving state B with maximum output, the loss of the smoothing capacitor 10 is small and the loss of the coil 9 is large. These losses are not negligible in comparison with the loss of FET, and therefore, it is necessary to take this point into consideration for the configuration of a motor drive control device. However, in the conventional art, this point has not been considered sufficiently.

In the motor drive control device A according to Embodiment 1, the smoothing capacitor 10 and the coil 9 are arranged, as shown in FIG. 1, with respect to the electrical connection member 7, on a switching element side, that is, the opposite side of the control board 1. Further, end surfaces of the smoothing capacitor 10 and the coil 9 (faces of their one ends farther from the electrical connection member 7) are in a plane shown by a broken line B in FIG. 1, and are positioned apart from a plane (shown by a broken line A) in which the switching elements 4 are placed. Furthermore, the location where the control board 1 is arranged and the location where the smoothing capacitor 10, the coil 9 and the switching elements 4 are arranged, are away from each other, with the electrical connection member 7 interposed between them, so that such a configuration is provided that heat generated by the smoothing capacitor 10, the coil 9 and the switching elements 4 is not easily transferred to the control board 1, the microcomputer 2 and the FET driving circuit 3.

In addition, a thickness of the heat sink 12 which is formed as integrated with, or independent of, the switching element placing portion 6, is thick around the switching elements 4, and is thin around where the smoothing capacitor 10 and the coil 9 are placed. By adopting such a configuration, the smoothing capacitor 10 and the coil 9, both tall ones, are located away from the control board 1, and the height of the motor drive control device A can be reduced; that is, the configuration allows downsizing of the device.

Further, because the thickness of the heat sink 12 around the switching elements 4 is made large, its heat capacity is large, so that heat generation by the switching elements 4 is reduced. A space is formed between the end surface of the smoothing capacitor 10 and the heat sink 12. By this space, such an effect is created that, if the inner pressure of the smoothing capacitor 10 increases, the heat sink 12 does not interfere, allowing the enclosure of the smoothing capacitor 10 to expand thereby decreasing the inner pressure.

It is noted that the coil 9 in FIG. 2 is shown as a coil for removing a noise, and this noise removing coil 9 is depicted as a single coil electrically connected to U-phase, V-phase and W-phase. However, it is not limited to be single, and such cases may be applied where two or more coils are connected in serial, and where two or more coils are connected in parallel.

By adopting the configuration as described above, it is possible to reduce temperature rise in the control board 1, the microcomputer 2 and the FET driving circuit 3, even if the driving state of the motor 20 is a state of maximum torque with low revolution speed or a state of maximum output, to thereby achieve a highly reliable and compact motor drive control device A.

As described above, the motor drive control device A according to Embodiment 1 comprises a switching element 4; a smoothing capacitor 10; and a coil 9, and includes an electrical connection member 7 that electrically connects the switching element 4 with the smoothing capacitor 10 and with the coil 9; a control board 1 that mounts a FET driving circuit 3; a control signal line 5 that electrically connects the switching element 4 and the control board 1; and a switching element placing portion 6 on which the switching element 4 is placed. In the configuration, the electrical connection member 7 is arranged between the switching element 4 and the control board 1, the smoothing capacitor 10 and the coil 9 are arranged, with respect to the electrical connection member 7, on a side of the switching element 4, that is, the opposite side of the control board 1. And, with respect to the electrical connection member 7, end surfaces of the smoothing capacitor 10 and the coil 9 arranged on the side of the switching element 4, are positioned apart from a plane where the switching element 4 and the switching element placing portion 6 are adjoined together. Accordingly, it is possible to spread the distance not only between the control board 1 and the switching element 4, but also between the control board and the smoothing capacitor 10 & coil 9; therefore, such an effect is created that temperature rise in the control board 1 and the control element constituting the FET driving circuit 3 is suppressed thereby enhancing the reliability. In addition, the electrical connection member 7 has, for the control board 1, a blocking effect of heat generated by the switching element 4, the smoothing capacitor 10 and the coil 9.

Further, the end surface of the smoothing capacitor 10 or the coil 9 is positioned, with respect to the electrical connection member 7, apart from a plane where the switching element 4 and the switching element placing portion 6 are adjoined together, thereby creating an effect that the motor drive control device A can be made reduced in height, to be downsized.

Embodiment 2

Figure 5:
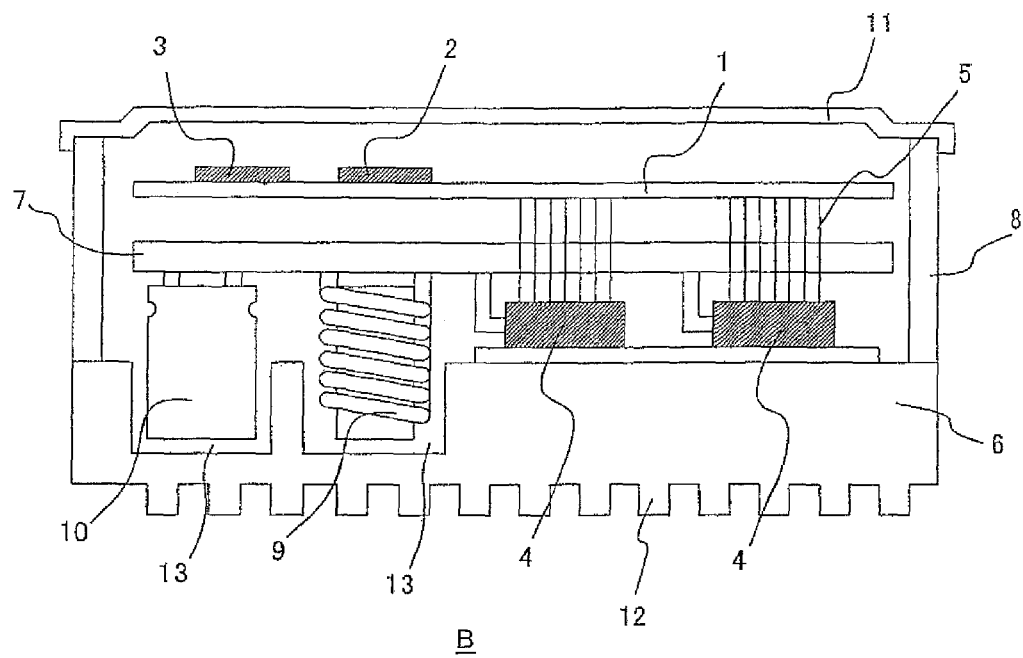
FIG. 5 is a diagram illustrating a motor drive control device for electric power steering according to Embodiment 2 of the invention.

Next, a motor drive control device according to Embodiment 2 will be described. FIG. 5 is a diagram showing the motor drive control device according to Embodiment 2.

As shown in FIG. 5, the motor drive control device B according to Embodiment 2 is configured basically similarly to Embodiment 1, but in which the smoothing capacitor 10 and the coil 9 are embedded in concave portions 13 (hereinafter, each referred to simply as a hole, in the respective embodiments). By thus embedding the smoothing capacitor 10 and the coil 9, both tall ones, in the holes 13, the motor drive control device B can be made smaller in height direction, and at the same time, a heat capacity of the heat sink 12 can be ensured sufficiently to thereby suppress temperature rise in the switching elements 4. Further, because the holes 13 for embedding the smoothing capacitor 10 and the coil 9, that is, spaces are formed, materials for and weight of the heat sink 12 can be reduced.

In addition, as shown in FIG. 5, a space is formed between the end surface of the smoothing capacitor 10 and the heat sink 12; therefore, like Embodiment 1, an effect is created by the space that if the inner pressure of the smoothing capacitor 10 increases, the heat sink 12 does not interfere, allowing the enclosure of the smoothing capacitor 10 to expand thereby decreasing the inner pressure.

Figure 6:
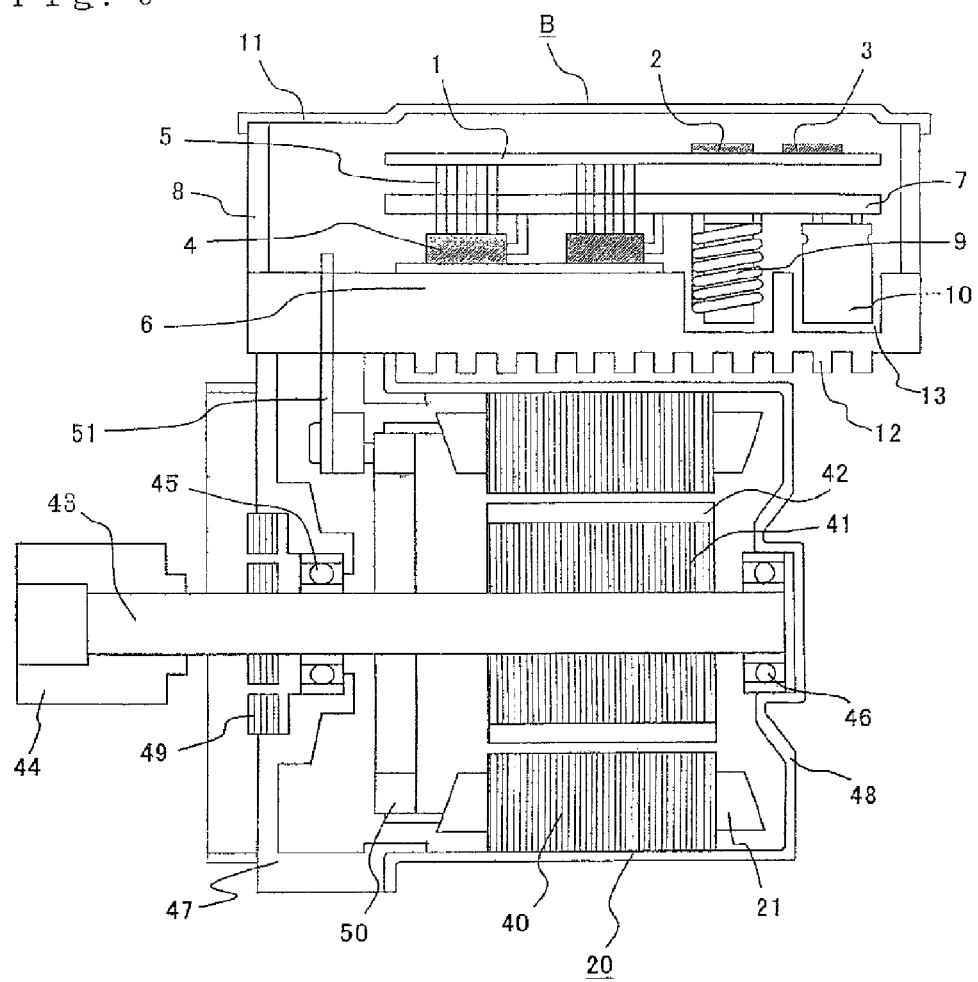
FIG. 6 is a diagram illustrating an integrated configuration with a motor, of the motor drive control device for electric power steering according to Embodiment 2 of the invention.

FIG. 6 shows a diagram of an integrated configuration of the motor drive control device B of FIG. 5 with the motor 20, and the structure of the motor 20 will be described below. In the motor 20, the armature windings 21 are wound around a stator core 40, and a rotor including a rotor core 41 and a permanent magnet 42 is positioned as facing to the stator core 40. A shaft 43 is press-fitted in a rotation-axial center of the rotor core 41 and a boss 44 that is a coupling with a shaft of the gear of an electric power steering system, is press-fitted in an end portion of the shaft 43.

The shaft 43 is supported by two bearings 45 and 46, thus providing a configuration for the rotor to be rotatable. One bearing 45 is fixed to a housing 47 of the motor 20, and the other bearing 46 is fixed to a frame 48 of the motor 20. On the front side of the housing 47, a resolver 49 is provided as a sensor for detecting a rotation angle of the motor 20.

The stator core 40 is fixed to the frame 48 by press fitting or shrink fitting, and the frame 48 is fixed to the housing 47. The armature winding 21 is electrically connected to a bus bar 51 through a terminal 50, so that the bus bar 51 and the motor drive control device B are electrically connected to each other. The bus bar 51, upon receiving current supply from the switching element 4, enables the motor 20 to be driven.

In the case of FIG. 6, the motor drive control device B is in an integrated form, mechanically connected to a housing portion on a circumference end portion of the motor 20. According to such a motor drive control device B in the integrated form, an effect is created that, although influenced by heat generation of the motor 20, temperature rise in the control board 1 can be reduced, because the motor 20 is away from the control board 1. In addition, although not shown, the housing 47 of the motor 20 is attached to a deceleration mechanism for reducing a speed of the motor 20, and therefore, heat in the heat sink 12 can be transferred to the deceleration mechanism through the housing 47.

Embodiment 3

Figure 7:
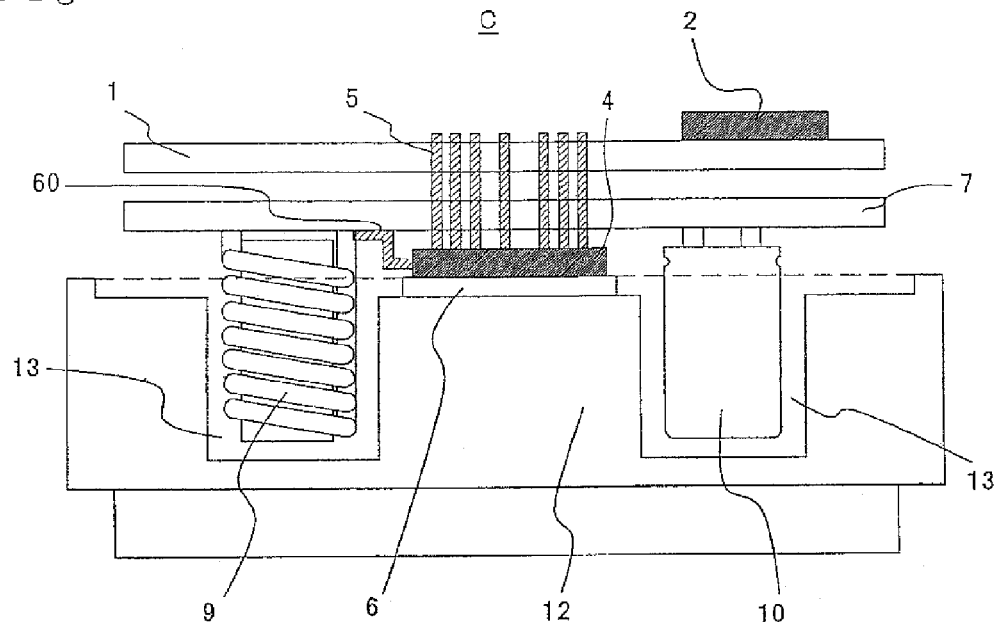
FIG. 7 is a diagram illustrating in side view a motor drive control device for electric power steering according to Embodiment 3 of the invention.

Next, a motor drive control device according to Embodiment 3 will be described. FIG. 7 is a diagram illustrating in side view the motor drive control device according to Embodiment 3. In FIG. 7, a partial cross section is shown for ease of comprehension.

The motor drive control device C according to Embodiment 3 can be arranged, as described later, in an axial direction of the motor, and here, the lower side of FIG. 7 is a front side (a side nearer to the gear), and the upper side is a rear side (a side farther from the gear).

In FIG. 7, a control board 1 on which a microcomputer 2 and a control element such as an FET driving circuit (not shown) are mounted, is located in the upper portion, and under the control board 1, an electrical connection member 7 formed of a bus bar and an insulating member (both not shown) is located, to which a smoothing capacitor 10 and the coil 9 are electrically connected. Also, switching element 4 is connected to the electrical connection member 7 through a terminal 60.

The switching element 4 is electrically connected to the control board 1 through control signal lines 5. Further, the switching element 4 is configured to be placed on a switching element placing portion 6 so that their generating heat is released to a heat sink 12 that is formed as integrated with, or independent of, the switching element placing portion 6. Here, holes 13 are formed in the heat sink 12, and the smoothing capacitor 10 and the coil 9 are embedded in the holes 13. Further, a space is formed between an end surface of the smoothing capacitor 10, that is one of its end surfaces and is farther from the electrical connection member 7, and an end surface of the heat sink 12.

Figure 8:
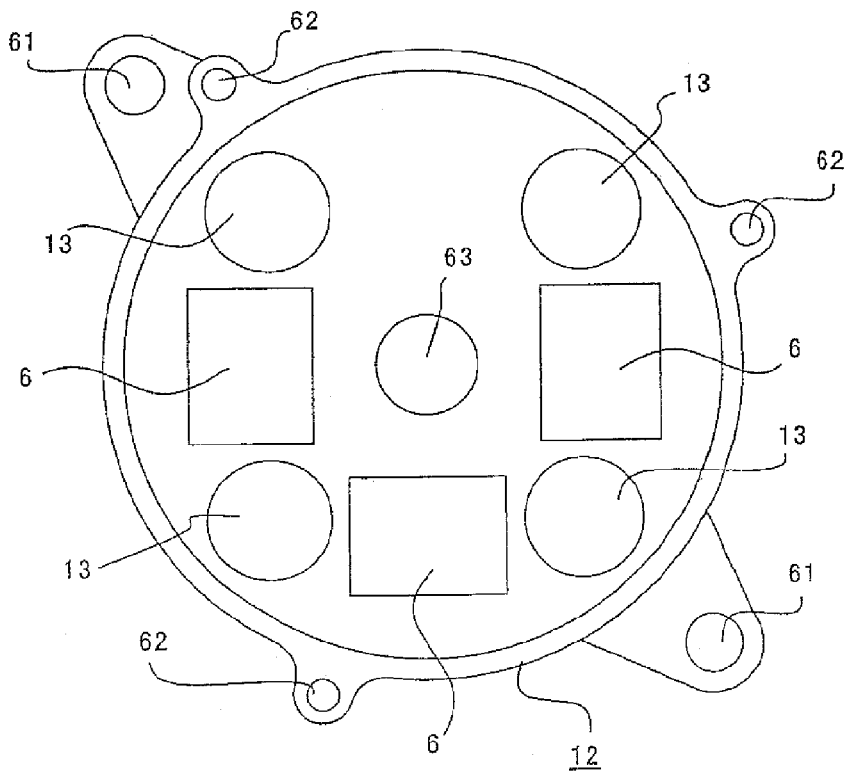
FIG. 8 is a diagram of a heat sink, viewed from a rear side, of the motor drive control device for electric power steering according to Embodiment 3 of the invention.

Then, a diagram of the heat sink 12 viewed from the rear side is shown as FIG. 8. As shown in FIG. 8, the outline of the heat sink 12 viewed from the rear side is approximately circular, and at a periphery of which, screw holes 61 for coupling with a gear side portion are formed at two locations, and these screw holes 61 are positioned 180 degrees or approximately 180 degrees opposite to each other. At three locations axially apart from the screw holes 61, screw holes 62 are formed; they are for coupling with a housing to be described later, and are formed at three locations that are 120 degrees apart from each other in FIG. 8.

In the center of the heat sink 12, a hollow 63 for passing through a shaft 43 of the motor 20 is formed. Around the hollow 63, switching element placing portions 6 in rectangle shape are provided at total three locations. Each switching element placing portion 6 corresponds to the switching element placing portion 6 in FIG. 7, and the surface of which is finely finished to be flat for ensuring a uniform contact state with the switching elements 4. In addition, adjacent to the switching element placing portions 6, circular holes 13 are formed. This holes 13 corresponds to the holes 13 in FIG. 7, in which the smoothing capacitor 10 and the coli 9 are embedded. Here, in the case of FIG. 7, for embedding three smoothing capacitors 10 and one coil 9, total four number of the holes are formed.

Figure 9:
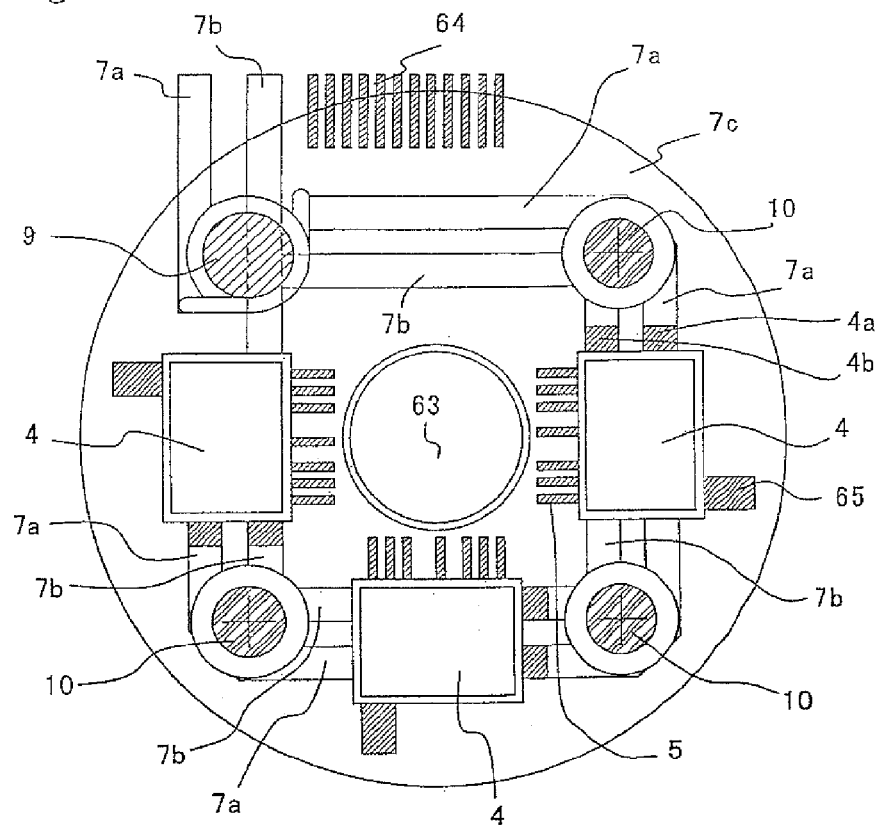
FIG. 9 is a diagram of an electrical connection portion, viewed from a front side, of the motor drive control device for electric power steering according to Embodiment 3 of the invention.

FIG. 9 is a diagram illustrating the electrical connection member 7, the smoothing capacitors 10, the coils 9 and the switching element 4, viewed from the front side. Each electrical connection member 7 is formed of a positive (+)-side bus bar 7a, a negative (−)-side bus bar 7b and a frame 7c made of an insulating material such as a resin. The frame 7c serves to hold the bus bars 7a & 7b and a terminal 64 that is a signal line from a connector, and to ensure electrical insulation between these components and other components. Although the bus bars 7a and 7b are to be connected to a battery 30 (see FIG. 1), the positive side of the battery 30 is electrically connected, through a harness and a connector electrode, to the positive (+)-side bus bar 7a shown at the upper left in FIG. 9. Each positive (+)-side bus bar 7a is connected to one terminal of the coil 9, and the other terminal is connected again to another positive (+)-side bus bar. Further, the positive (+)-side bus bars 7a are so arranged as to form a square shape.

On the other hand, the negative (−)-side bus bars 7b are so arranged as to form a square shape to be electrically connected to each other, and the negative (+)-side bus bar 7b shown at the upper left in FIG. 9 is connected, through a harness and a connector electrode, to the negative side of the battery 30.

Further, to the positive (+)-side bus bars 7a and the negative (−)-side bus bars 7b, the smoothing capacitors 10 and the switching elements 4 are connected. In FIG. 9, three smoothing capacitors 10 are arranged, and are connected to be positioned at the corners of the bus bars 7a and 7b arranged in a square shape. The switching elements 4 are connected, through terminals 4a and 4b, to the bus bars 7a and 7b. Each switching element 4 is provided with a motor terminal 65 through which a current is supplied to the motor 20.

As shown in FIG. 7, the control signal lines 5 extend from the switching elements 4 toward the control board 1. As a structure of the switching element 4, a conceivable one is a module of a MOS-FET bare chip and a shunt resistance that are resin molded. By applying a resin molded structure of a bare chip, it is possible for the switching element 4 to transfer their generating heat efficiently to the switching element placing portion 6, to thereby create a reducing effect of temperature rise in the switching element 4. Accordingly, temperature rise in the control board 1 and the control element are suppressed. Note that the switching element 4 is not limited to the above, and may comprise a structure in which a bare chip is mounted on a ceramic substrate.

Figure 10:
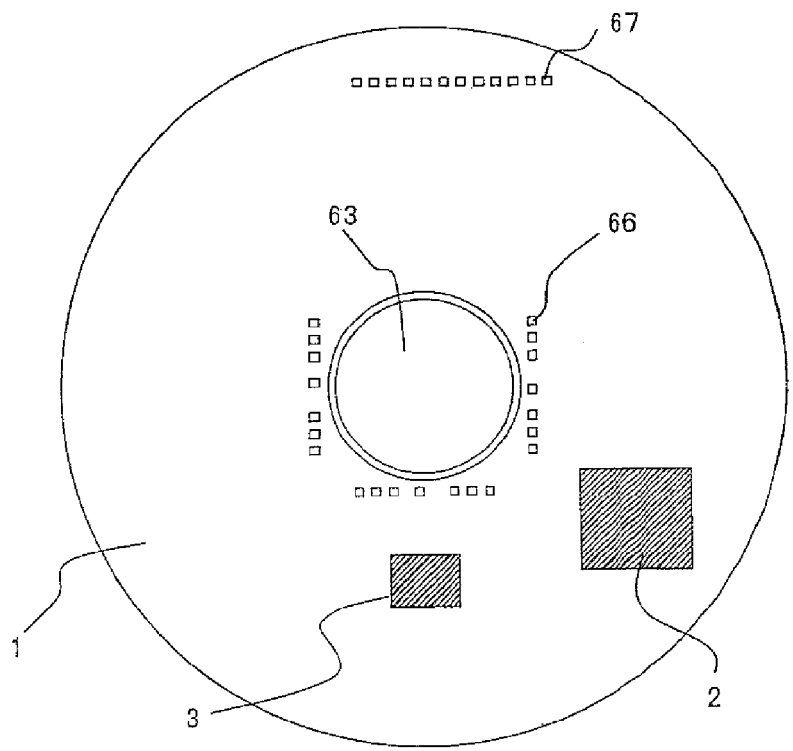
FIG. 10 is a diagram of a control board, viewed from a rear side, of the motor drive control device for electric power steering according to Embodiment 3 of the invention.

FIG. 10 is a schematic diagram showing the control board 1 viewed from the rear side. In FIG. 10, details of its circuit are omitted, to show only schematically.

A microcomputer 2 and a FET driving circuit 3 are mounted on the control board 1, in the center of which a hollow 63 for passing through a shaft 43 of the motor 20 is formed, and around the hollow 63, apertures 66 for passing through the control signal lines 5 are formed in a given number. In an upper portion in view directed into FIG. 10, apertures 67 for passing through terminals that are signal lines from a connector, are formed in a given number.

By stacking the heat sink 12 in FIG. 8, the electrical connection member 7, the smoothing capacitors 10 and the coil 9 in FIG. 9, and the control board 1 in FIG. 10, in the axial direction of the motor 20, into an assembled state, there is provided the motor drive control device C shown in FIG. 7.

As described the above, in the motor drive control device C according to Embodiment 3, a thickness of the heat sink 12 which is formed as integrated with, or independent of, the switching element placing portion 6, is thick around the switching elements 4, and is thin around where the smoothing capacitor 10 and the coil 9 are placed. By adopting such a configuration, the smoothing capacitor 10 and coil 9, both tall ones, are located away from the control board 1, and the height of the motor drive control device C can be reduced; that is, the configuration allows downsizing of the device. Further, because the thickness of the heat sink 12 around the switching elements 4 is made large, its heat capacity is large, so that heat generation by the switching elements 4 is reduced.

Further, a space is formed between the end surface of the smoothing capacitor 10 and the heat sink 12; therefore, such an effect is created that, if the inner pressure of the smoothing capacitor 10 increases, the heat sink 12 does not interfere, allowing the enclosure of the smoothing capacitor 10 to expand thereby decreasing the inner pressure.

Further, even if the driving state of the motor 20 is a state of maximum torque with low revolution speed or a state of maximum output, it is possible to reduce temperature rise in the control board 1, the microcomputer 2 and the FET driving circuit 3, to thereby achieve a highly reliable and compact motor drive control device C.

Furthermore, the switching elements 4 are divisionally arranged in the number equal to a phase number of the motor 20 (in case of three-phase motor, divided into three), and therefore, heat concentration can be avoided, creating an effect of making uniform the temperature in the heat sink. In addition, the smoothing capacitor 10 and the coil 9 are arranged between the switching elements of the respective phases, and therefore, heat dissipation using the heat sink 12 can be effected without heat concentration.

Figure 11:
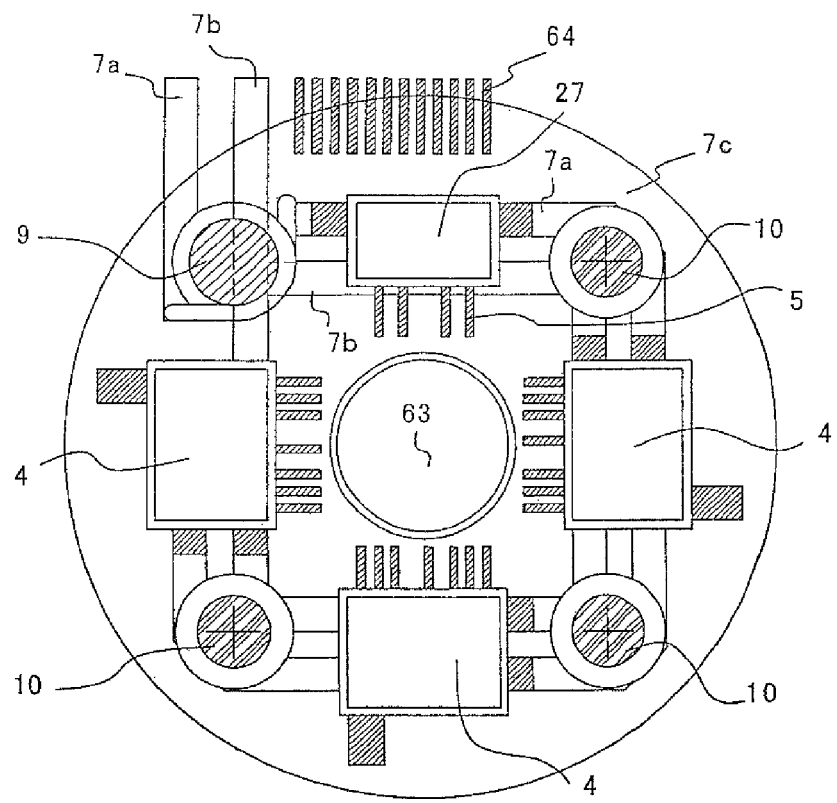
FIG. 11 is a diagram of another example of electrical connection portion, viewed from a front side, of the motor drive control device for electric power steering according to Embodiment 3 of the invention.

FIG. 11 shows a configuration in which a power relay 27 is added to the configuration in FIG. 9. The power relay 27 is connected to the bus bar 7a that is connected to one terminal of the coil 9, so that a current can be shut off between said bus bar and another bus bar 7a of positive (+) side at the later stage. Although its location is different from that of the power relay 27 in FIG. 2, the function to shut off a current flowing from the battery 30 into the motor drive control device C is the same.

Figure 12:
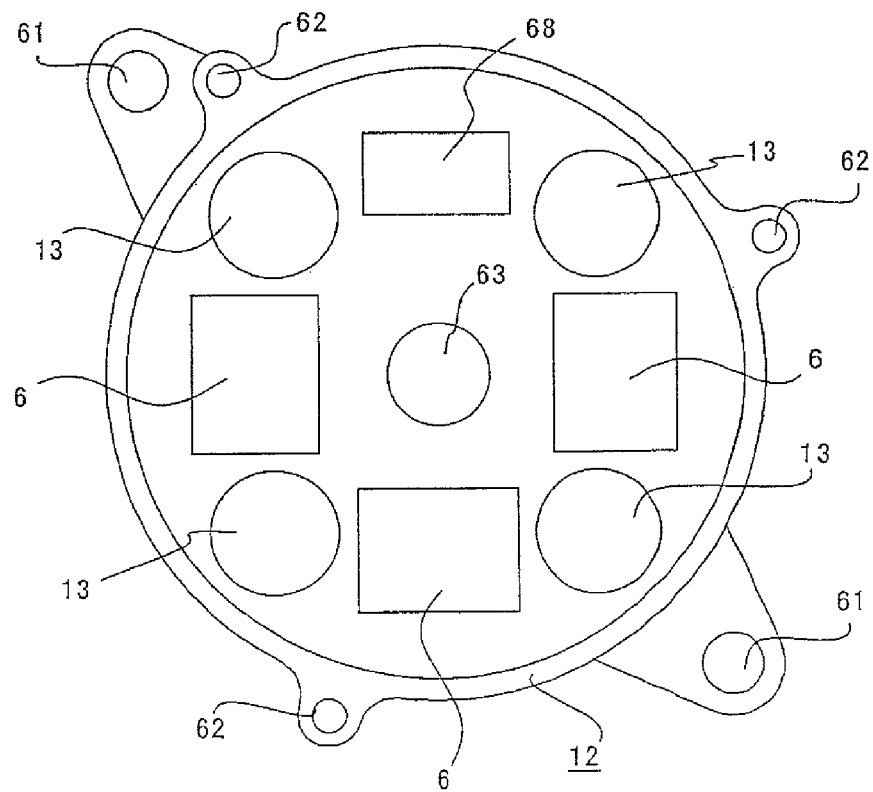
FIG. 12 is a diagram of another example of heat sink, viewed from a rear side, of the motor drive control device for electric power steering according to Embodiment 3 of the invention.

FIG. 12 is a diagram of the heat sink 12 for mounting the power relay 27, viewed from the rear side. In the upper portion in FIG. 12, a switching element placing portion 68 for the power relay 27 is located, and on the switching element placing portion 68, the power relay 27 is placed, so that its generating heat can be released therefrom to the heat sink 12 thereby reducing temperature rise in the power relay 27. One power relay 27 and three switching elements 4 are configured to be arranged approximately at concyclic positions.

The above configuration is a configuration in which the power relay 27 is arranged, with respect to the electrical connection member 7, on a side of the switching element (opposite side of the control board); therefore, in addition to in the driving state of low revolution speed with maximum torque of the motor 20 (see FIG. 2), even in a maximum heat generating state of the power relay 27, that is, in a driving state of a maximum input current from the battery 30 of the motor drive control device C, it is possible to suppress temperature rise in the control board 1 and the control element constituting FET driving circuit 3.

Further, in the configuration, the switching elements 4 for supplying a current for driving the motor 20 are arranged as divided into three phases; the power relay 27 is provided; the switching elements 4 and the power relay 27 in total four number are arranged side by side; and between the respective ones of them, the smoothing capacitor 10 and the coil 9 are arranged. Thus, heat generating by the switching elements 4 and the power relay 27, and heat generating by the smoothing capacitors 10 and the coils 9, are dissipated, thereby creating an effect of reducing the temperature rise.

Figure 13:
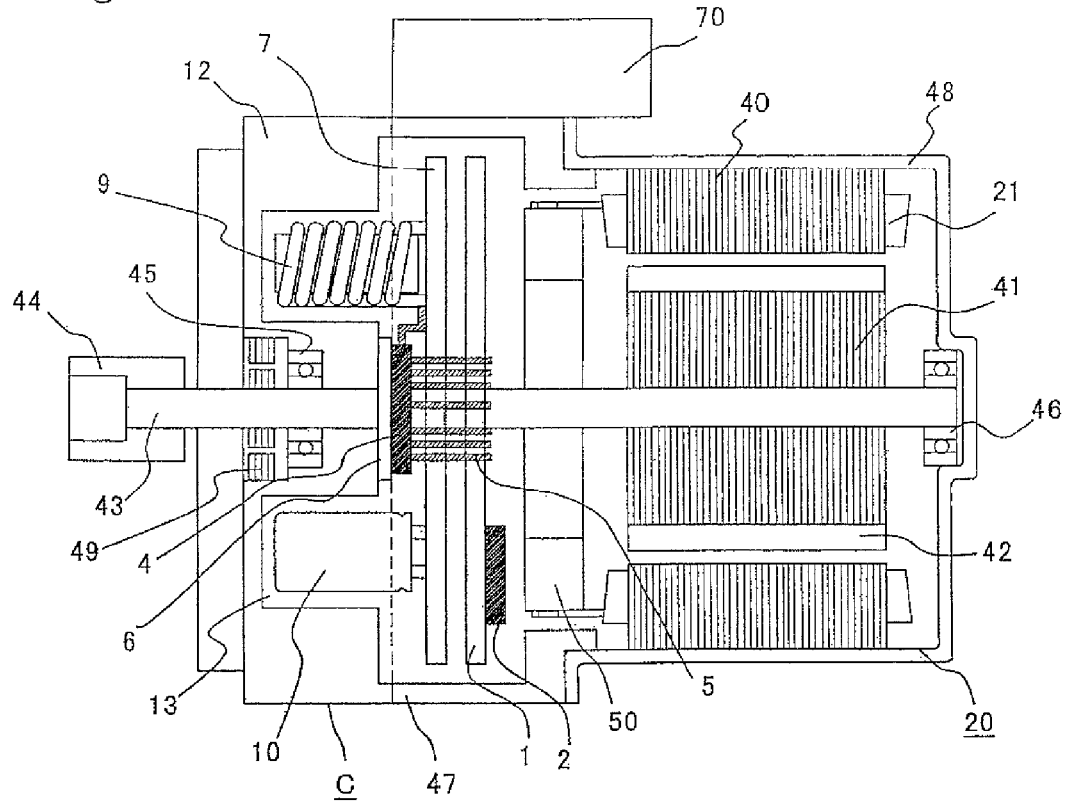
FIG. 13 is a diagram illustrating a motor drive control device for electric power steering according to Embodiment 3 of the invention, that is placed on a front side of a motor and is integrated with the motor.

FIG. 13 is a diagram illustrating the motor drive control device C that is arranged on a front side of the motor 20 as integrated therewith. The motor drive control device C described by FIG. 7 is arranged on a front side of the motor 20. A connector 70 receives a power supply and predetermined information, such as a steering torque, vehicle speed information and the like, as electrical signals, and the electrical signals are sent to the electrical connection member 7 and the control board 1. The smoothing capacitor 10 and the coil 9 are configured to be embedded in the holes 12 formed in the heat sink 12. The heat sink 12 and a housing 47 are coupled together by screw (not shown), and the housing 47 and a frame 48 of the motor 20 are coupled together by screw (not shown).

The configuration of the motor 20 will be described below. Armature windings 21 are wound around a stator core 40, and a rotor including a rotor core 41 and a permanent magnet 42 is positioned as facing to the stator core 40. A shaft 43 is press-fitted in a rotation-axial center of the rotor core 41 and a boss 44 that is a coupling with a shaft of the gear of an electric power steering system, is press-fitted in an end portion of the shaft 43.

The shaft 43 is supported by two bearings 45 and 46, thus providing a configuration for the rotor to be rotatable. One bearing 45 is fixed to the heat sink of the motor drive control device C, and the other bearing 46 is fixed to the frame 48 of the motor 20. On the front side of the heat sink 12, a resolver 49 is provided as a sensor for detecting a rotation angle of the motor 20.

The stator core 40 is fixed to the frame 48 by press fitting or shrink fitting, and the frame 48 is fixed to the housing 47. The armature winding 21 is electrically connected to a bus bar (not shown) through a terminal 50, and the bus bar (not shown) and the motor drive control device C are electrically connected to each other. The bus bar (not shown), upon receiving current supply from the switching element 4, enables the motor 20 to be driven.

Figure 14:
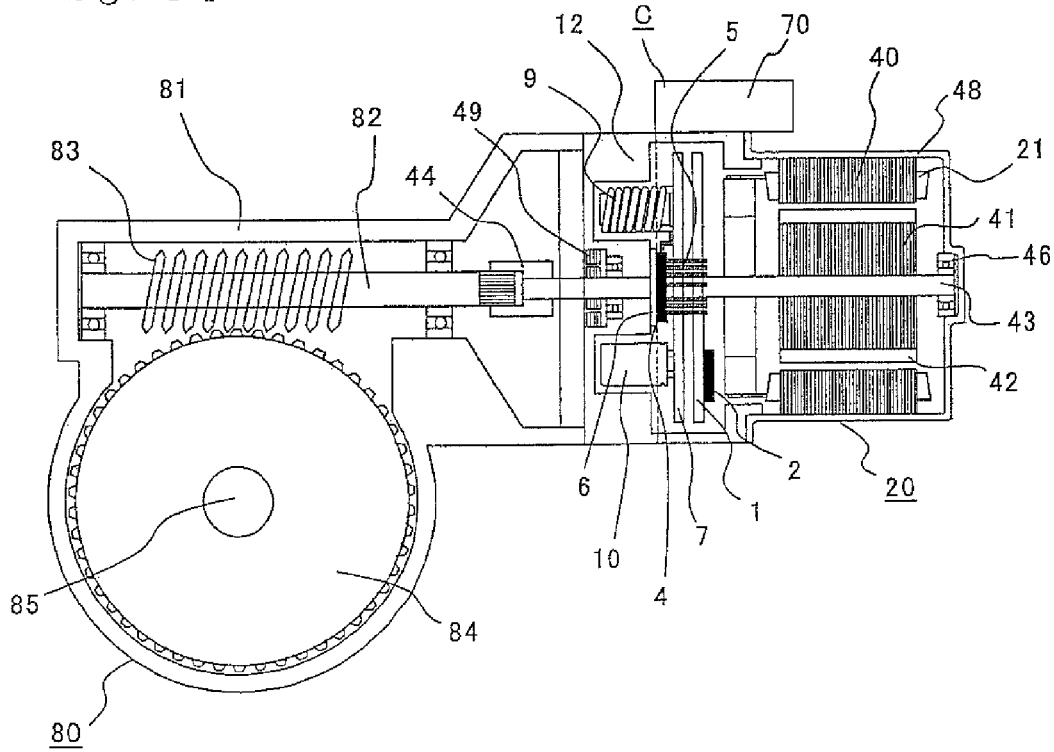
FIG. 14 is a diagram illustrating an electric power steering system according to Embodiment 3 of the invention.

FIG. 14 is a diagram illustrating an electric power steering system. The heat sink 12 is fixed by screw (not shown) to a housing 81 of a deceleration mechanism 80, to be in a state attached thereto. A boss 44 is joined to a worm gear shaft 82, so that torque of the motor 20 is transmitted to the worm gear shaft 82 to rotate the worm gear shaft 82. Then, a worm gear 83 rotates a worm wheel 84 and a steering shaft 85 mechanically connected to the worm wheel 85.

When the motor drive control device C is thus arranged on an end portion of the motor 20 in a rotation shaft direction thereof, it is possible, by adjusting a thickness of the heat sink 12, to suppress temperature rise in the switching element 4, the smoothing capacitor 10 and the coil 9. In addition, because the motor drive control device C is arranged on the end portion of the motor 20 in a rotation shaft direction thereof, it does not become larger in radial direction if the thickness of the heat sink 12 is made larger, thereby creating an effect that its ease of mounting in vehicles is less affected.

The motor drive control device C according to Embodiment 3 is electrically and mechanically connected to the motor 20 as integrated therewith, and is arranged on an end portion of the motor 20 in a rotation shaft direction thereof and on a side of the worm gear (the deceleration mechanism side); therefore, it is possible to dissipate heat from the heat sink 12 to the worm gear 83, thereby creating an effect that heat dissipating capability is enhanced for the smoothing capacitor 10, the coil 9, the switching element 4 and the power relay 27.

Meanwhile, if the switching element 4 is provided with a motor relay or a shunt resistance, the loss becomes larger and temperature rise in the control board 1 and the control element is more problematic; however, according to this embodiment, it is possible to spread the distances from the control board 1 and the control element to the motor relay and to the shunt resistance, thereby creating an effect that such temperature rise is suppressed to enhance the reliability. In addition, because of the motor relay, a current to the motor 20 and the motor drive control device C can be shut off. The shunt resistance is effective to enhance an accuracy of current detection.

Embodiment 4

Figure 15:
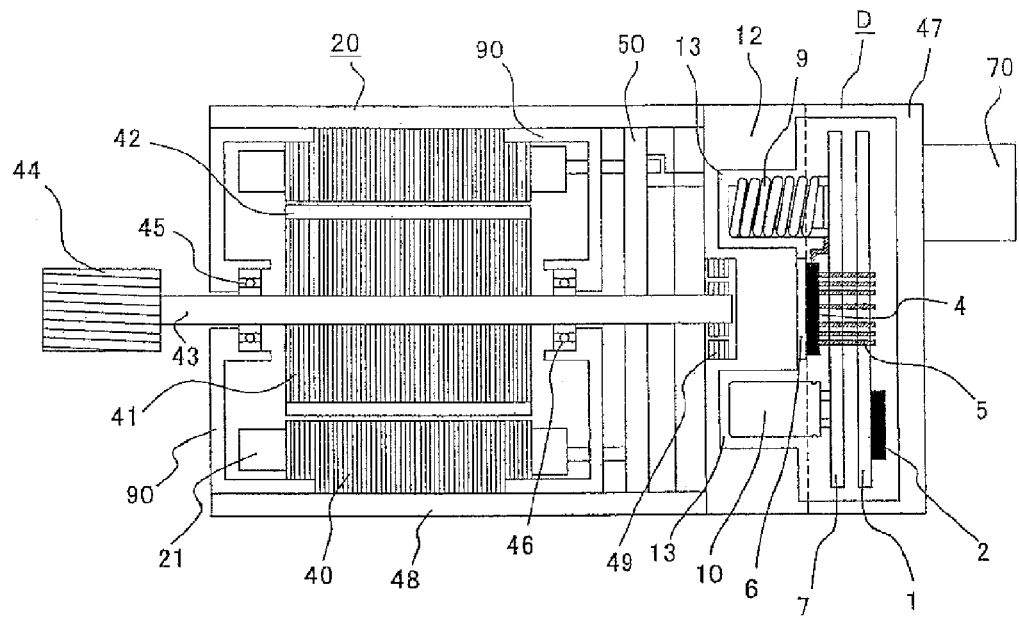
FIG. 15 is a diagram illustrating a motor drive control device for electric power steering according to Embodiment 4 of the invention, that is placed on a rear side of a motor and is integrated with the motor.

Next, a motor drive control device according to Embodiment 4 will be described. FIG. 15 is a diagram illustrating the motor drive control device according to Embodiment 4, in which an example is illustrated where the motor drive control device is placed on an opposite side (rear side of the motor) to a side of the gear for electric power steering (deceleration mechanism side), to provide an integrated form.

The motor drive control device D according to Embodiment 4 comprises a control board 1 that mounts a microcomputer 2, and an electrical connection member 7 with which a coil 9 and a smoothing capacitor 10 are electrically connected on a side of the motor 20 with respect to the control board 1, in which a switching element 4 is placed on a switching element placing portion 6, and a heat sink 12 that is integrated with or independent of the switching element placing portion 6 is provided. In the heat sink 12, holes 13 are formed in which the smoothing capacitor 10 and the coil 9 are embedded. The motor drive control device D is a covered one with a housing made of metal or resin.

A connector 70 is attached on the back side, through which a power from the battery 30 (see FIG. 2) and a signal from a torque sensor or of a vehicle speed or the like, are supplied. Meanwhile, the motor 20 comprises a stator core 40 and armature windings 21 wound around the stator core 40, in which covers 90 are attached to both of rotation axial end portions of the stator core 40. The covers 90 and the stator core 40 are fixed to a frame 48 by shrink fitting or the like. The frame is formed of, for example, aluminum, and is fixed to the heat sink 12 by screw (not shown) to be attached thereto.

A rotor including a rotor core 41 and a permanent magnet 42, is positioned as facing to the stator core 40. A shaft 43 is press-fitted in a rotation-axial center of the rotor core 41. Two bearings 45 and 46 are provided for the shaft 43, and the bearings 45 and 46 are fixed to the covers 90, thus providing a configuration for the rotor to be rotatable. To an end portion of the shaft 43, a boss 44 is attached so as to be joined with a gear of an electric power steering system. In this embodiment, such a mechanism is assumed that a belt is looped around the boss to operate a ball screw by the belt.

In addition, to the other end portion of the shaft 43, a resolver 49 is provided as a rotation angle sensor. The rotation angle sensor is not limited to the resolver 49, and may be formed of a permanent magnet and a GMR sensor, in combination.

Figure 16:
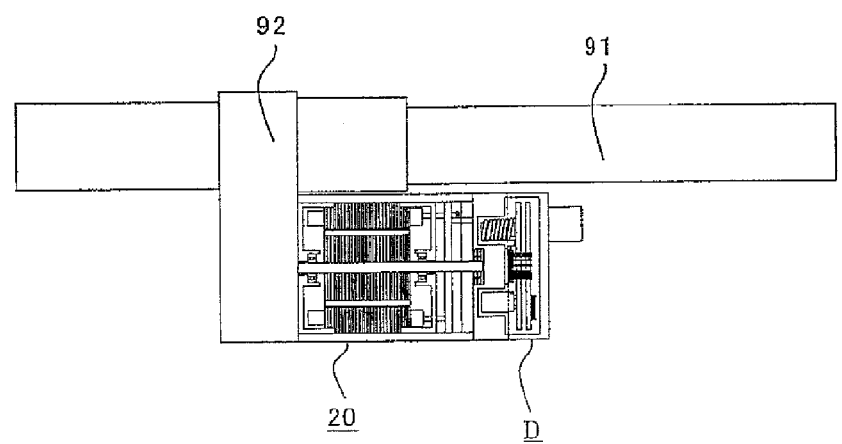
FIG. 16 is a diagram illustrating an electric power steering system according to Embodiment 4 of the invention.

FIG. 16 a diagram illustrating an electric power steering system including the motor 20 and the motor drive control device D described in FIG. 15, and represents an electric power steering system of a so-called rack parallel type in which the motor 20 and the motor drive control device D are arranged in parallel to a rack shaft 91.

In FIG. 16, the motor 20 is joined to a gear box 92. The gear box 92 includes a deceleration mechanism using a belt (not shown) and a ball screw (not shown). The rotation of the motor 20 is decelerated by the deceleration mechanism, and then converted to a thrust force of the rack shaft 91.

As described above, the motor drive control device D according to Embodiment 4 is electrically and mechanically connected to the motor 20 as integrated therewith, and is arranged on an end portion of the motor 20 in a rotation shaft direction thereof and on an opposite side (back side of the motor) of the gear for electric power steering; therefore, it is possible to dissipate heat from the heat sink 12 to the gear through the frame 48 of the motor 20, thereby creating an effect that heat dissipating capability is enhanced for the smoothing capacitor 10, the coil 9, the switching element 4 and a power relay 27 (see FIG. 2). Also, it is possible to arrange the connector 70 of the motor drive control device D on the back side of the motor 20, thereby enhancing its ease of mounting in vehicles.

Further, because the heat sink 12 is attached to the frame 48 of the motor 20, the heat sink 12 acts to dissipate heat toward the gear box through the frame 48, thereby creating an effect that temperature rise in the switching element 4, the smoothing capacitor 10 and the coil 9 is reduced.

Embodiment 5

Figure 17:
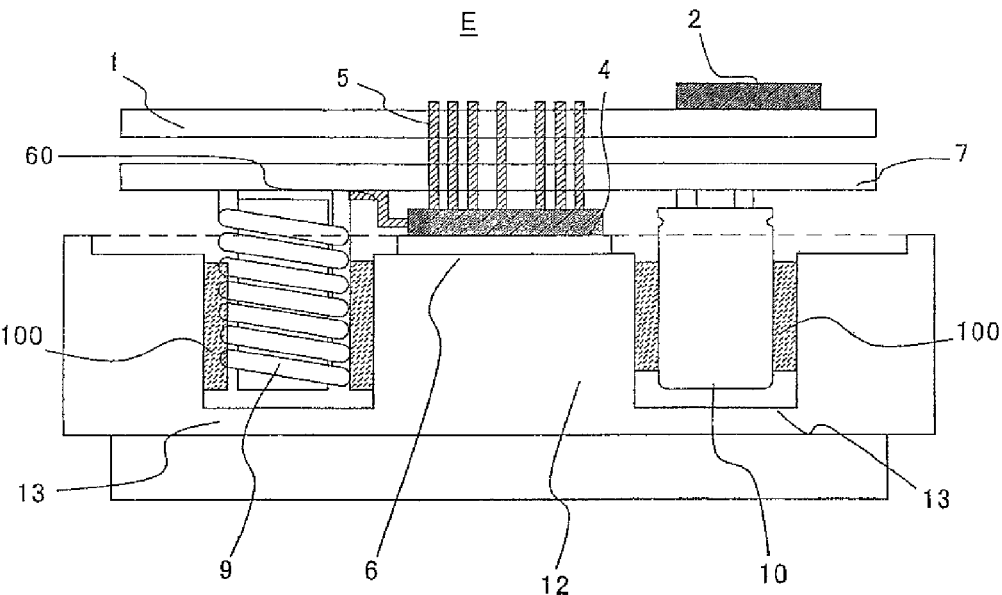
FIG. 17 is a diagram illustrating a motor drive control device for electric power steering according to Embodiment 5 of the invention.

Next, a motor drive control device according to Embodiment 5 will be described. FIG. 17 is a diagram illustrating the motor drive control device according to Embodiment 5.

While the motor drive control device E according to Embodiment 5 is an example where the smoothing capacitor 10 and the coil 9 are embedded in the holes 13 formed in the heat sink 12, resins 100 are interposed between the smoothing capacitor 10 and the heat sink 12, and between the coil 9 and the heat sink 12. With such a configuration, heat conductivity is improved between the smoothing capacitor 10 and the heat sink 12, and between the coil 9 and the heat sink 12, thereby reducing temperature rise.

Note that, in FIG. 17, the resin 100 is not filled in on a height-wise end portion of the smoothing capacitor 10, but filled in its circumferential outer side. By forming a space on the height-wise end portion, an effect is created that, if the inner pressure of the smoothing capacitor 10 increases, the smoothing capacitor 10 is allowed to expand thereby decreasing the inner pressure.

Embodiment 6

Next, a motor drive control device according to Embodiment 6 will be described.

Figure 18:
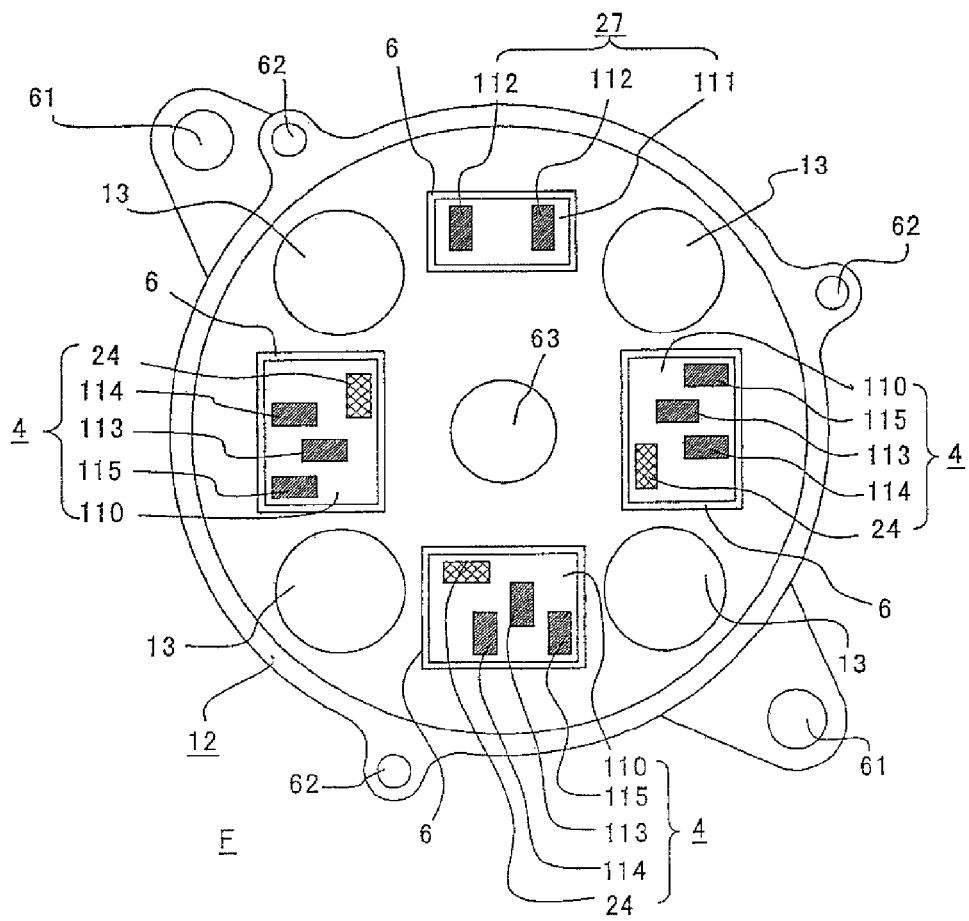
FIG. 18 is a diagram of a heat sink, viewed from a rear side, of the motor drive control device for electric power steering according to Embodiment 5 of the invention.

FIG. 18 is diagram illustrating the motor drive control device F according to Embodiment 6, in which an example is shown where a switching element 4 having a ceramic substrate 110 is placed on switching element placing portions 6 on a heat sink 12. One power relay 27 and three switching elements 4 are arranged approximately at concyclic positions, and between the respective ones of them, holes 13 for placing one coil 9 and three smoothing capacitors 10 are formed.

The power relay 27 includes a ceramic substrate 111 and two bare chips of MOS-FET 112, and each of the switching elements 4 for three phases includes the ceramic substrate 110, three MOS-FET 113, 114 and 115, and one shunt resistance 24. Here, electrical connections by wire bonding for the bare chips and the shunt resistance 24 are omitted in the figure.

The MOS-FET 113 is placed on a positive (+)-side arm, the MOS-FET 114 and the shunt resistance 24 are placed on a negative (−)-side arm, and the MOS-FET 115 is placed on a motor side. Generally, the MOS-FET 115 is in normally-on state and serves, if necessary, to electrically disconnect the motor (description omitted in Embodiment 6), that is, serves as a motor relay.

Meanwhile, the switching elements 4 for three phases are commonly designed, thereby allowing cost reduction. As the ceramic substrate 110, a DBC (Direct Bonded Copper) substrate or a DBA (Direct Bonded Aluminum) substrate may be used, for example. When the DBC substrate is used, heat generated by the MOS-FETs 113, 114 and 115 and by the shunt resistance 24 can be released efficiently to the heat sink 12 by means of a thin copper plate (thin aluminum plate, in the case of the DBA substrate) and the ceramic, thereby reducing temperature rise in the MOS-FETs 113, 114 and 115 and in the shunt resistance 24. The ceramic substrate 110 may be adjoined through an adhesive, or fixed by a solder, to the switching element placing portion 6.

As described above, according to the motor drive control device F of Embodiment 6, heat generated by the switching element 4 is transferred efficiently by the ceramic substrate 110 to the switching element placing portion 6, thereby creating an effect of reducing temperature rise in the switching element 4. Accordingly, temperature rise in the control board and the control element can be suppressed.

Various modifications and variations of the invention may readily occur to any one skilled in the art without deviating from the scope and spirit of the invention, and it should be understood that the invention is not limited to the descriptions of the embodiments above.

The invention claimed is:

1. A motor drive control device for electric power steering, that is for driving and controlling a motor used in an electric power steering system, the motor drive control device comprising:

a switching element that supplies a current to the motor;
one or more coil(s);
one or more smoothing capacitor(s);
an electrical connection member that electrically connects the switching element with the smoothing capacitor(s) and with the coil(s);
a control board that mounts a microcomputer and a driving circuit that is connected to the switching element via a direct electrical connection;
a control signal line that electrically connects the switching element with the control board;
a switching element placing portion on which the switching element is placed;
a heat sink that embeds the one or more smoothing capacitor(s) in a first concave portion and embeds the one or more coil(s) in a second concave portion, wherein the first concave portion and the second concave portion are spaced apart from each other, and the switching element and the switching element placing portion are placed on the heat sink between the first concave portion and the second concave portion; and
a resin which is interposed between circumferential outer sides of the one or more smoothing capacitors(s) and sidewalls of the first concave portion
wherein the electrical connection member is arranged between the switching element and the control board and has a surface that extends to the switching element so that the switching element is separated from the control board and the driving circuit by the electrical connection member, and at least one of the smoothing capacitor(s) and at least one of the coil(s) are arranged, with respect to the electrical connection member, on a side where the switching element is placed,
wherein end surface of the smoothing capacitor(s) and the coil(s) arranged on the side where the switching element is placed, are positioned, with respect to the electrical connection member, apart from a plane where the switching element and the switching element placing portion are adjoined together, and
wherein the motor drive control device is integrated with and connected electrically and mechanically to the motor, to be arranged on an end portion of the motor in a rotation shaft direction thereof, coaxially with the rotation shaft, and the motor drive control device is on a side where a deceleration mechanism for reducing a speed of the motor is provided or on another side opposite to the side where the deceleration mechanism is provided.

* * * * *